(12) United States Patent
Ha et al.

(10) Patent No.: US 7,279,785 B2
(45) Date of Patent: Oct. 9, 2007

(54) STACKED DIE PACKAGE SYSTEM

(75) Inventors: Jong-Woo Ha, Seoul (KR); Myung Kil Lee, Seoul (KR); Hyun Uk Kim, Seoul (KR); Taebok Jung, Seoul (KR)

(73) Assignee: Stats Chippac Ltd., Singapore (SG)

( * ) Notice: Subject to any disclaimer, the term of this patent is extended or adjusted under 35 U.S.C. 154(b) by 24 days.

(21) Appl. No.: 11/164,160

(22) Filed: Nov. 12, 2005

(65) Prior Publication Data

US 2006/0180914 A1   Aug. 17, 2006

Related U.S. Application Data

(60) Provisional application No. 60/653,059, filed on Feb. 14, 2005.

(51) Int. Cl.
*H01L 23/02*      (2006.01)
*H01L 21/00*      (2006.01)
*H01L 21/66*      (2006.01)
*G01R 31/26*      (2006.01)

(52) U.S. Cl. ............... 257/686; 257/685; 257/E23.085; 257/E25.006; 257/E25.013; 438/14; 438/15; 438/109

(58) Field of Classification Search ................ 257/686, 257/777, 666, 685, 723, E27.064, E23.085; 438/109
See application file for complete search history.

(56) References Cited

U.S. PATENT DOCUMENTS

| | | | | |
|---|---|---|---|---|
| 4,859,632 | A | * | 8/1989 | Lumbard ..................... 29/593 |
| 6,835,598 | B2 | | 12/2004 | Baek et al. ................. 438/109 |
| 6,906,416 | B2 | | 6/2005 | Karnezos .................... 237/723 |
| 6,933,598 | B2 | | 8/2005 | Karnezos .................... 237/686 |
| 2003/0183930 | A1 | * | 10/2003 | Fukasawa .................... 257/734 |
| 2004/0065963 | A1 | * | 4/2004 | Karnezos .................... 257/777 |

* cited by examiner

*Primary Examiner*—Long K. Tran
(74) *Attorney, Agent, or Firm*—Mikio Ishimaru (57) ABSTRACT

A stacked die package system including forming a bottom package including a bottom substrate and a bottom die mounted and electrically connected under the bottom substrate and forming a top package including a top substrate and a top die mounted and electrically connected over the top substrate. Mounting the top package by the top substrate over the bottom substrate and electrically connecting the bottom and top substrates. Mounting system electrical connectors under the bottom substrate adjacent the bottom die.

16 Claims, 8 Drawing Sheets

STACKED DIE PACKAGE SYSTEM

CROSS-REFERENCE TO RELATED APPLICATION(S)

This application claims the benefit of U.S. Provisional Patent Application Ser. No. 60/653,059 filed Feb. 14, 2005, and the subject matter thereof is hereby incorporated herein by reference thereto.

TECHNICAL FIELD

The present invention relates generally to integrated circuit package systems, and more particularly to a system for forming a stacked die package system.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

Multiple die module designs have responded to the need for increasing the number of electronic devices, such as integrated circuits or memory dies, within smaller areas. Initially, dies or dies were connected in an unpackaged, bare form in a horizontal plane. More recently, the industry has begun implementing integration by stacking dies. Three-dimensional packaging of this type offers higher die density and less required interconnect density than two-dimensional multiple die substrates. Furthermore, stacking provides a dense die structure having the footprint of a one-die package, and obtaining thicknesses that have been continuously decreasing.

The primary practical limitation to the number of dies that can be stacked in a stacked die package system is the low final test yield of the stacked-die package. It is inevitable that some of the die in the package will be defective to some extent, and therefore the final package test yield will be the product of the individual die test yields, each of which is always less than 100%. This can be particularly a problem even if only two die are stacked in a package but one of them has low yield because of design complexity or technology.

As integrated circuit packages become smaller, it is also increasingly difficult to test each die separately, due to handling difficulties since the individual die are stacked with adhesive or spacer and in between on a substrate. Further, because the quality of the die cannot be determined, defects in the module can be found only after the module has been assembled.

As a result, the yield of the semiconductor module is lowered while its cost increases. For this reason, a need still therefore exists for a system allowing separate testing of each die package in an efficient manner while providing an efficient use of the limited amount of space. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked die package system including forming a bottom package including a bottom substrate and a bottom die mounted and electrically connected under the bottom substrate and forming a top package including a top substrate and a top die mounted and electrically connected over the top substrate. Mounting the top package by the top substrate over the bottom substrate and electrically connecting the bottom and top substrates. Mounting system electrical connectors under the bottom substrate adjacent the bottom die.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGS. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between elements.

The terminology of "first", "second", etc. is used merely for convenience to designate different embodiments or elements and not to designate a particular sequence or limitation. Also as a matter of convenience, like elements are given the same number in different figures.

The term "processing" as used herein includes deposition of material or photoresist, patterning, exposure, development, etching, cleaning, and/or removal of the material or photoresist as required in forming a described structure.

Stacked die package systems include one or more dies and/or packages, and the packages include one or more dies. All of the systems, packages, and dies have electrical connections that are wire or solder connectors in various configurations. The substrates described herein can be made from various materials including dielectric, conductive, and semiconductor materials in different combinations. Often, the substrates are laminates having a dielectric core and foil or printed wiring patterns on the top and bottom connected by conductive vias. The top views of the stacked die package are rectangular and well known to those skilled in the art.

Figure 1:
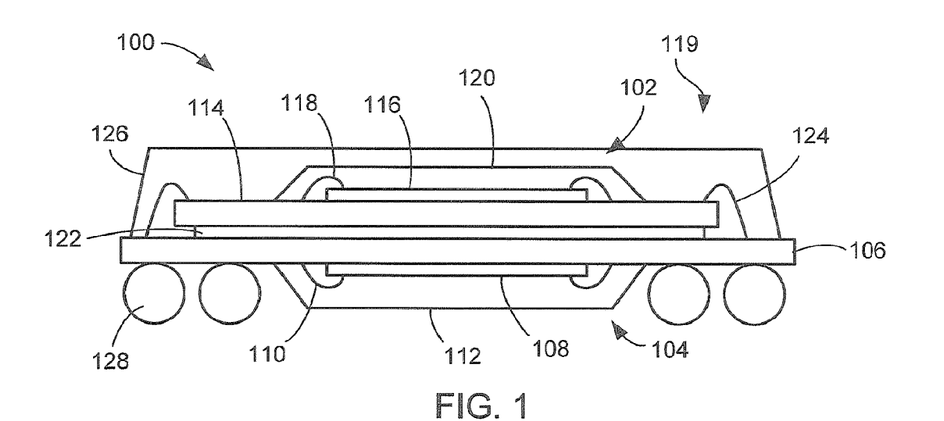
FIG. 1 is a cross-sectional view of a stacked die package system of a first type in accordance with an embodiment of the present invention.

Referring now to FIG. 1, therein is shown a cross-sectional view of a stacked die package system 100 of a first type in accordance with an embodiment of the present invention. Systems of the first type are characterized by having electrical connectors that are wire connectors.

The stacked die package system 100 includes a top package 102 and a bottom package 104.

The bottom package 104 includes a bottom substrate 106 and a bottom die 108 attached on the bottom of the bottom substrate 106. The bottom die 108 is electrically connected to the bottom substrate 106 by electrical connectors, such as wires 110. The bottom die 108 and the wires 110 are encapsulated within a bottom encapsulant 112 for protection from the environment.

The top package 102 includes a top substrate 114 and a top die 116 attached on the top of the top substrate 114. The top die 116 is electrically connected to the top substrate 114 by electrical connectors, such as wires 118. The top die 116 and the wires 118 are encapsulated within a top encapsulant 120 that protects the components of the top package 102 from the environment during handling.

The top package 102 is attached to the bottom package 104 by an adhesive 122 and is electrically connected by electrical connectors, such as wires 124. The top package 102 and the wires 124 are encapsulated within a topside encapsulant 126 to form a topside package 119 for protection of the wires 124 from the environment.

System electrical connectors, such as solder balls 128, are bonded to the bottom of the bottom substrate 106 around the bottom die 108 and the bottom encapsulant 112. The solder balls 128 and the bottom encapsulant 112 are sized so that the bottom encapsulant 112 is clear of any structures under the stacked die package system 100 in use.

Figure 2:
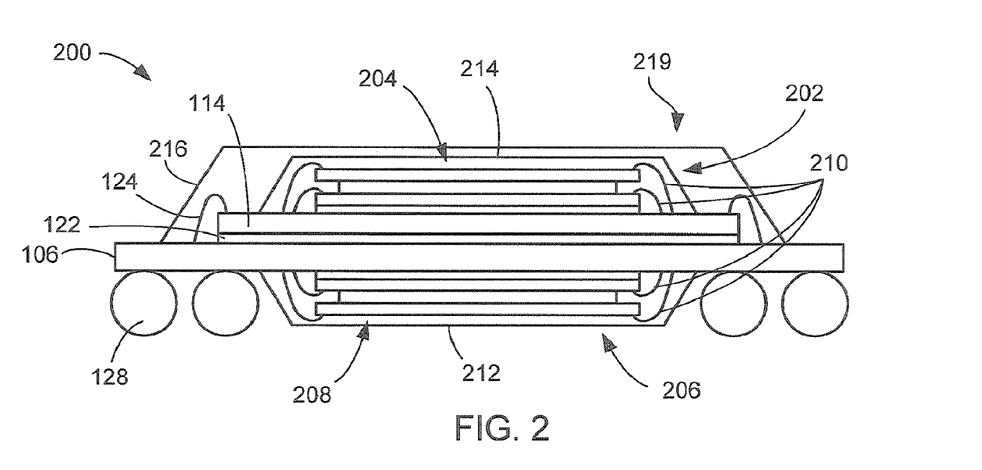
FIG. 2 is a cross-sectional view of a stacked die package system of the first type in accordance with another embodiment of the present invention.

Referring now to FIG. 2, therein is shown a cross-sectional view of the first type of stacked die package system 200 in accordance with another embodiment of the present invention. Similar elements to FIG. 1 use the same numbers.

A top package 202 may include two or more stacked dies 204 on the top substrate 114. A bottom package 206 may also include two or more stacked dies 208. The stacked dies 204 and 208 are wire bonded to other dies and to the bottom substrate 106 by electrical connectors, such as wires 210.

Bottom, top, and topside encapsulants 212, 214, and 216 have greater vertical thicknesses to accommodate the increased numbers of dies. The bottom encapsulant 212 is part of the bottom package 206, the top encapsulant 214 is part of the top package 202, and the topside encapsulant 216 is part of the topside package 219.

Figure 3A:
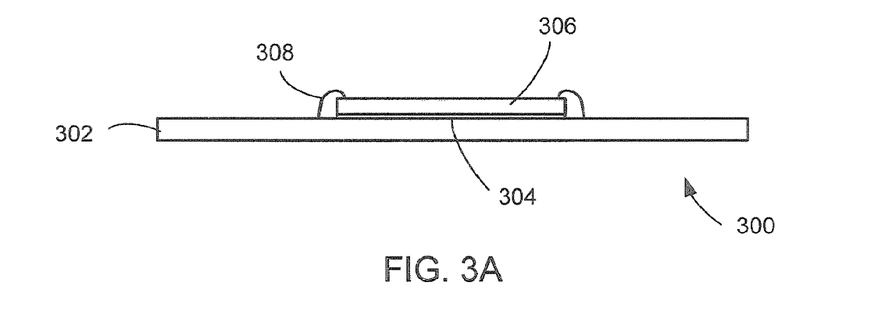
FIG. 3A is a cross-sectional view of a bottom package of the first type of stacked die package system in an intermediate stage of manufacture.

Referring now to FIG. 3A, therein is shown a cross-sectional view of a first type of stacked die package system 300 in an intermediate stage of manufacture.

A bottom substrate 302 is placed upside down and an adhesive 304 is applied to what will become the bottom of the bottom substrate 302 and a bottom die 306 is attached. Electrical connectors, such as wires 308, electrically connect the bottom die 306 to the bottom substrate 302. The adhesive 304 may be cured to further solidify the connection between the bottom die 306 and the bottom substrate 302.

Figure 3B:
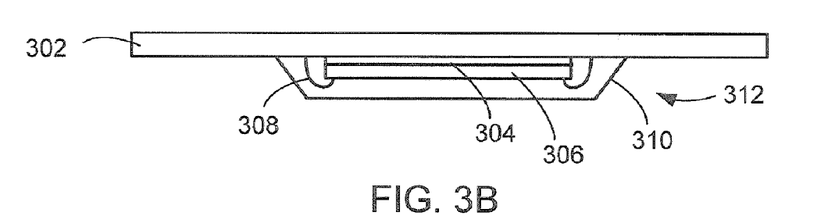
FIG. 3B is a cross-sectional view of the bottom package of the first type of stacked die package system in accordance with a further embodiment of the present invention.

Referring now to FIG. 3B, therein is shown a cross-sectional view of a bottom package 312 of the first type of stacked die package system 300 in accordance with a further embodiment of the present invention.

An encapsulation process is used in which a mold (not shown) is injected with an encapsulant 310 to encapsulate the adhesive 304, the bottom die 306, and the wires 308 to form the bottom package 312. The bottom package 312 has been flipped over in preparation for further processing. Testing may be performed at this stage to confirm that the bottom package 312 will be a "known good" package.

Figure 3C:
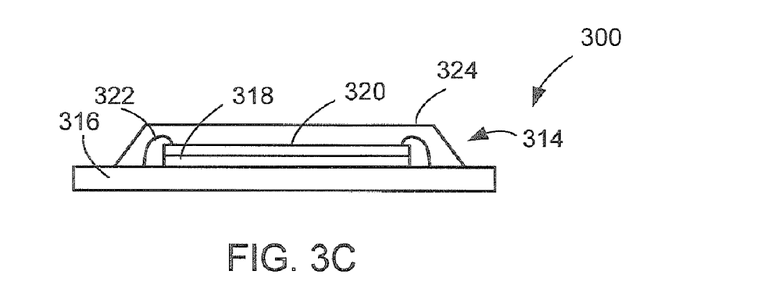
FIG. 3C is a cross-sectional view of a topside package of the first type of stacked die package system in accordance with a further embodiment of the present invention.

Referring now to FIG. 3C, therein is shown of a top package 314 of the first type of stacked die package system 300 in accordance with a further embodiment of the present invention. The top package 314 includes a top substrate 316 having a top die 320 bonded thereto by an adhesive 318. Electrical connectors, such as wires 322, electrically connect the top die 320 to the top substrate 316.

An encapsulation process is used in which a mold (not shown) is injected with an encapsulant 324 to encapsulate the adhesive 318, the top die 320, and the wires 322 to form the top package 314. Testing may be performed at this stage to confirm that the top package 314 will be a "known good" system.

Figure 3D:
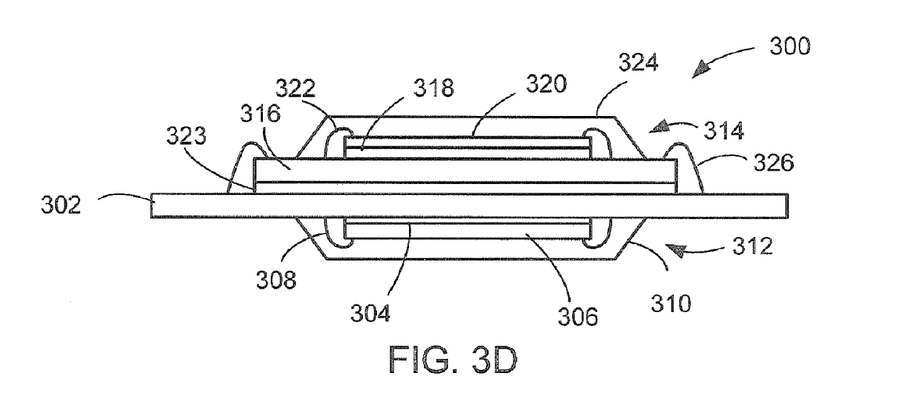
FIG. 3D is a cross-sectional view of the bottom package joined with the topside package.

Referring now to FIG. 3D, therein is shown a cross-sectional view of the bottom package 312 joined with the top package 314.

The top package 314 is attached to the bottom substrate 302 of the bottom package 312 by an adhesive 323. Electrical connectors, such as wires 326, electrically connect the top substrate 316 to the bottom substrate 302.

Figure 3E:
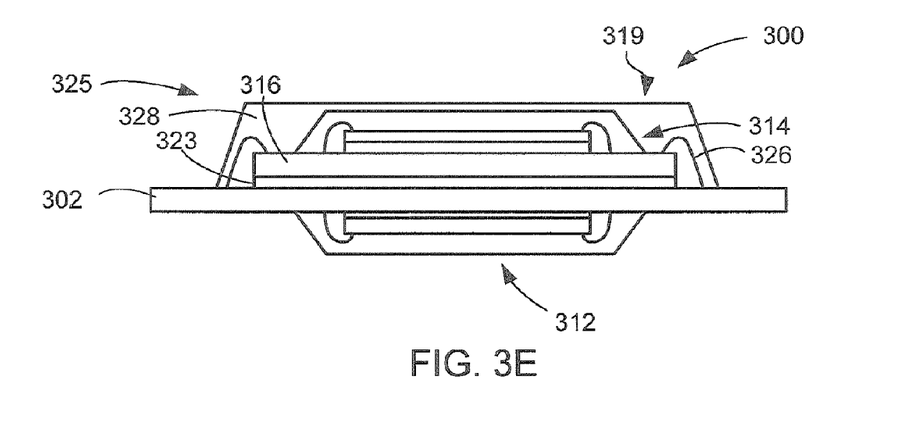
FIG. 3E is the structure of FIG. 3D after a further encapsulation step.

Referring now to FIG. 3E, therein is shown the structure of FIG. 3D after a further encapsulation step.

An encapsulation process is used in which a mold (not shown) is injected with an encapsulant 328 to encapsulate the adhesive 323, the top package 314, and the wires 326 to form a topside package 325. The topside encapsulant 328 is part of a topside package 319.

Figure 3F:
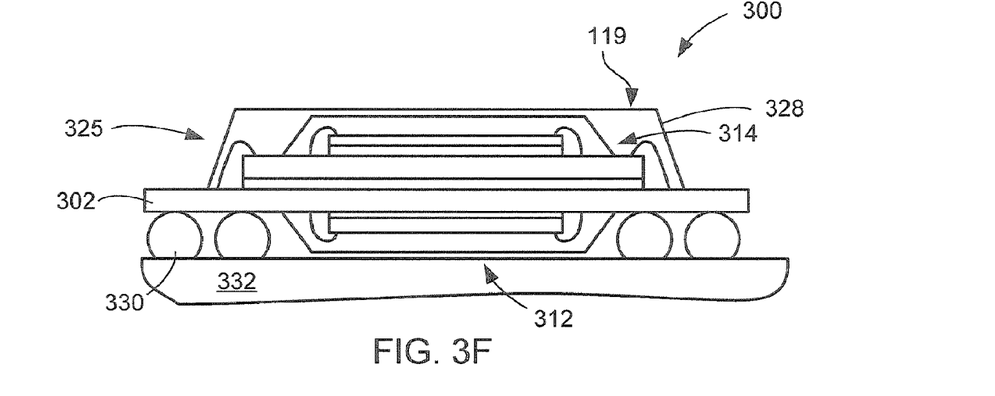
FIG. 3F is the structure of FIG. 3E in an attaching step.

Referring now to FIG. 3F, therein is shown the structure of FIG. 3E in a ball attach step. System electrical connectors, such as solder balls 330, are attached to wiring on the bottom of the bottom substrate 302. This provides the stacked die package system 300.

The stacked die package system 300 can then be mounted on a structure such as another stacked die package system or a printed circuit board 332 using the system electrical connectors.

Figure 4:
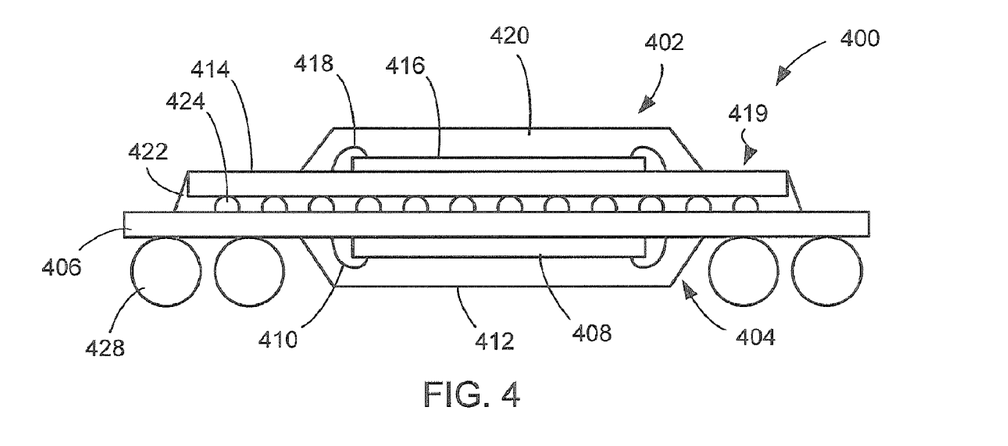
FIG. 4 is a cross-sectional view of a second type of stacked die package system in accordance with an embodiment of the present invention.

Referring now to FIG. 4, therein is shown a cross-sectional view of stacked die package system 400 of a second type in accordance with an embodiment of the present invention. The second type of stacked die package systems are characterized by having electrical connectors, which are wires and solder connectors such as solder balls, bumps, or studs.

The stacked die package system 400 includes a top package 402 and a bottom package 404.

The bottom package 404 includes a bottom substrate 406 and a bottom die 408 attached on the bottom of the bottom substrate 406. The bottom die 408 is electrically connected to the bottom substrate 406 by electrical connectors, such as wires 410. The bottom die 408 and the wires 410 are encapsulated within a bottom encapsulant 412 for protection from the environment.

The top package 402 includes a top substrate 414 and a top die 416 attached on the top of the top substrate 414. The top die 416 is electrically connected to the top substrate 414 by electrical connectors, such as wires 418. The top die 416 and the wires 418 are encapsulated within a top encapsulant 420 for protection from the environment during manufacturing.

The top package 402 is attached to the bottom package 404 by an adhesive underfill 422, which surrounds and protects electrical connectors, such as solder connectors 424. The adhesive underfill 422 forms part of a topside package 419, which includes the top package 402. The solder connectors 424 electrically connect the top package 402 and the bottom package 404.

System electrical connectors, such as solder balls 428, are bonded to the bottom of the bottom substrate 406 around the bottom die 408. The solder balls 428 and the bottom encapsulant 412 are sized so that the bottom encapsulant 412 is clear of any structures under the stacked die package system 400 in use.

Figure 5:
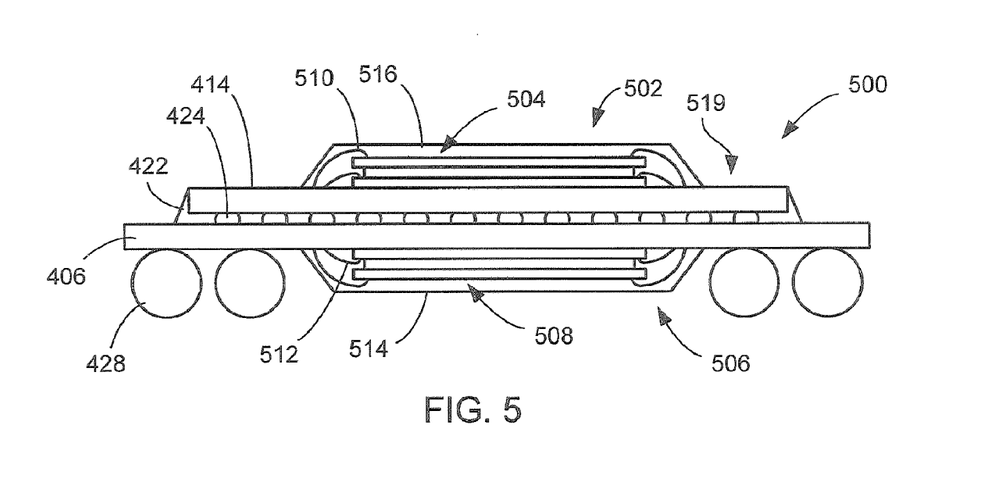
FIG. 5 is a cross-sectional view of the second type of stacked die package system in accordance with another embodiment of the present invention.

Referring now to FIG. 5, therein is shown a cross-sectional view of a stacked die package system 500 of a second type in accordance with another embodiment of the present invention. Similar elements to FIG. 4 use the same numbers.

A top package 502 may include two or more stacked dies 504 on the top substrate 414. A bottom package 506 may also include two or more stacked dies 508. The stacked dies are wire bonded to other dies and to the bottom substrate 406 by wires 510 and 512.

Top and bottom encapsulants 514 and 516 have greater vertical thicknesses to accommodate the increased numbers of dies. The adhesive underfill 422 forms part of a topside package 519, which includes the top package 502.

Figure 6A:
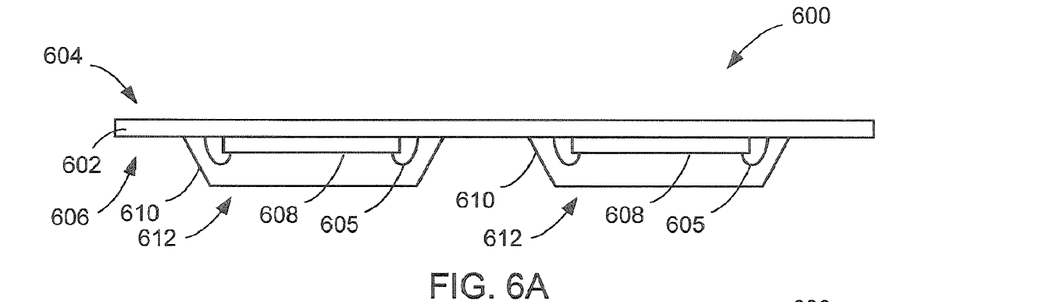
FIG. 6A is a cross-sectional view of the second type of stacked die package system in accordance with a further embodiment of the present invention.

Referring now to FIG. 6A, therein is shown a cross-sectional view of a second type of stacked die package system 600 in an intermediate stage of manufacture.

A long bottom substrate 602 has top and bottom surfaces 604 and 606. A number of bottom dies 608 have been mounted in line on the bottom surface 606 and electrically connected to wiring on the long bottom substrate 602 by electrical connectors, such as wires 605. The bottom dies 608 and the wires 605 have been individually encapsulated by encapsulant 610 to form bottom packages 612. The long bottom substrate 602 has been turned over to the position shown.

Figure 6B:
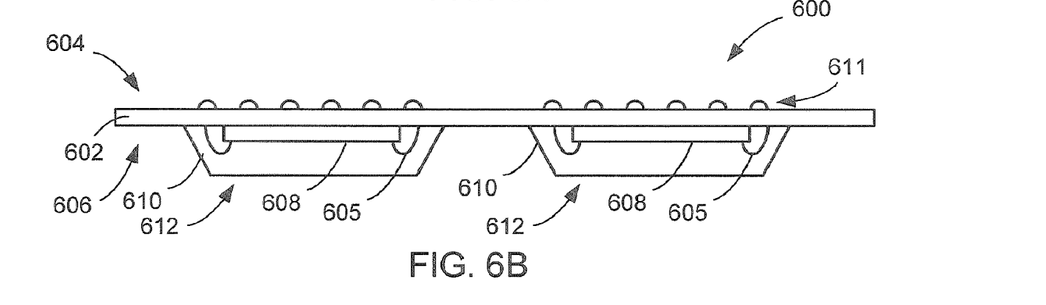
FIG. 6B is the structure of FIG. 6A after solder connectors are formed.

Referring now to FIG. 6B, therein is shown the structure of FIG. 6A after solder connectors 611 are formed. The solder connectors 611 may be formed by printing, screening, dropping or other techniques on wiring on the top surface 604 of the long bottom substrate 602.

Figure 6C:
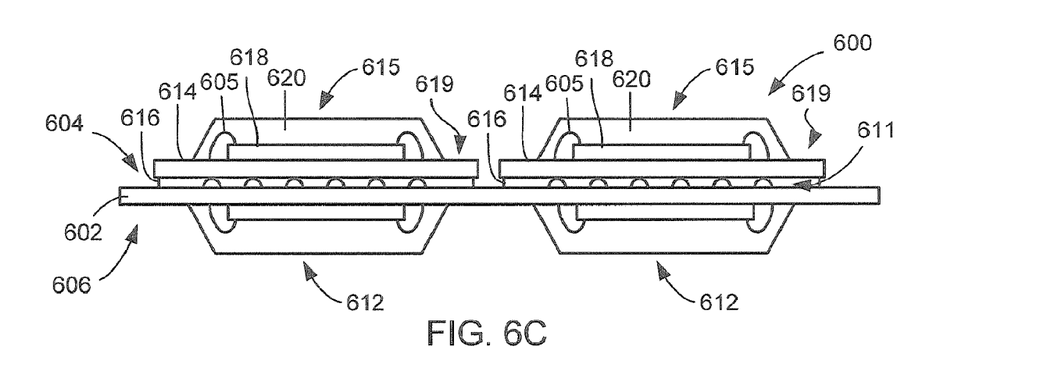
FIG. 6C is the structure of FIG. 6B mounting topside packages.

Referring now to FIG. 6C, therein is shown the structure of FIG. 6B after mounting top packages 615. The top packages 615 include top substrates 614, top dies 618 with wires 605, and top encapsulants 620. A number of top packages 615 are placed in line on the solder connectors 611 and bonded by an underfill adhesive 616 to the top surface 604 of the long bottom substrate 602.

Figure 6D:
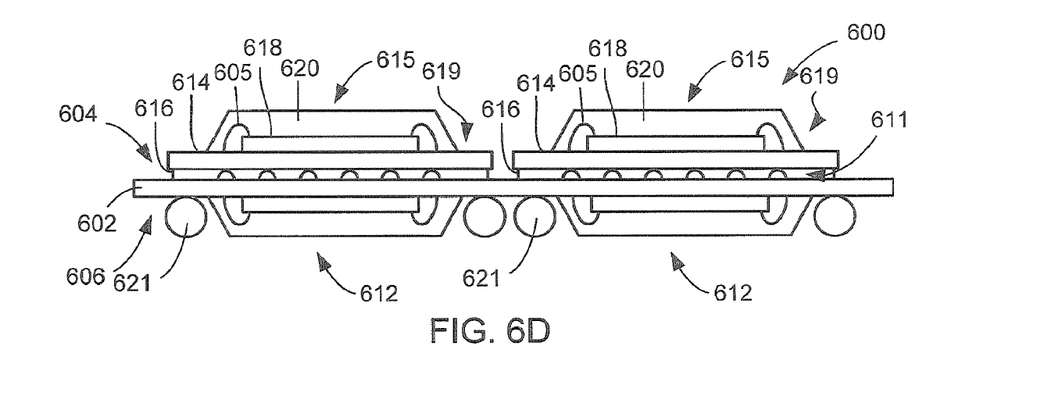
FIG. 6D is the structure of FIG. 6C in a ball attach step.

Referring now to FIG. 6D, therein is shown the structure of FIG. 6C in a ball attach step. System electrical connections, such as solder balls 621, are attached on the bottom of the long bottom substrate 602 to wiring on the bottom surface 606.

Figure 6E:
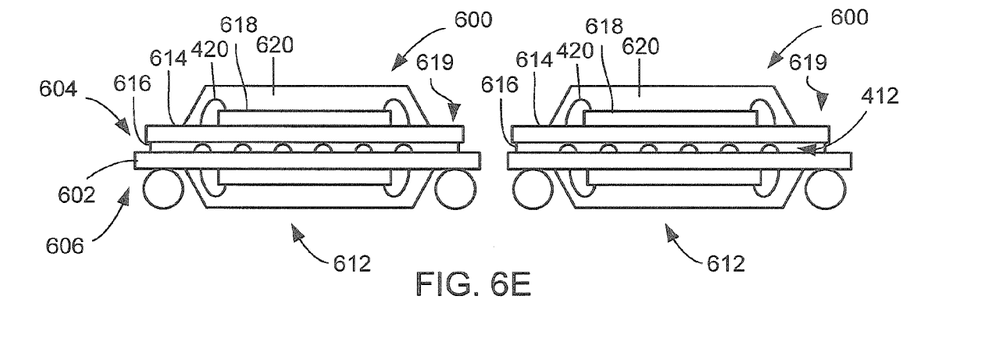
FIG. 6E is the structure of FIG. 6D after singulation.

Referring now to FIG. 6E, therein is shown the structure of FIG. 6D after singulation. The long bottom substrate 602 is singulated into a number of stacked die package systems 600.

Figure 7:
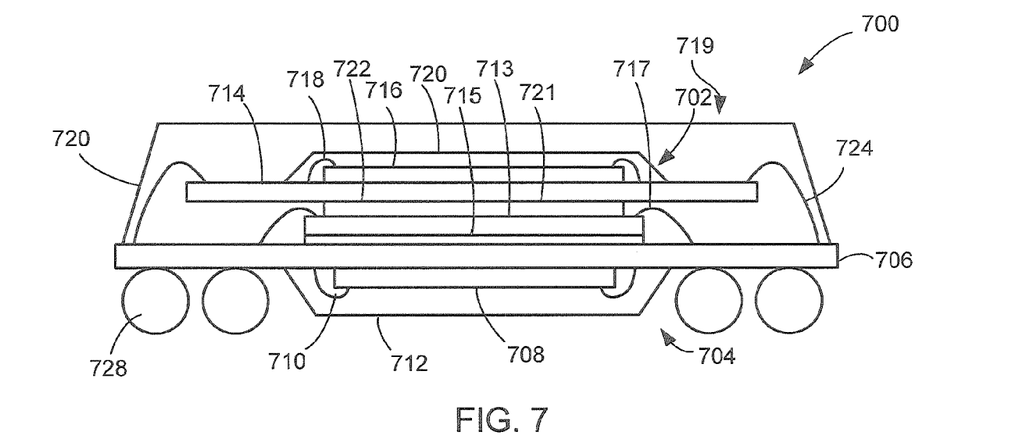
FIG. 7 is a cross-sectional view of stacked die package system of a third type in accordance with an embodiment of the present invention.

Referring now to FIG. 7, therein is shown a stacked die package system 700 of a third type in accordance with an embodiment of the present invention. The third type of stacked die package system is characterized in having at least one die between substrates.

The stacked die package system 700 includes a top package 702 and a bottom package 704.

The bottom package 704 includes a bottom substrate 706 and a bottom die 708 attached on the bottom of the bottom substrate 706. The bottom die 708 is electrically connected to the bottom substrate 706 by electrical connectors, such as wires 710. The bottom die 708 and the wires 710 are encapsulated within a bottom encapsulant 712 for protection from the environment.

A topside die 713 is attached to the bottom substrate 706 by an adhesive 715 and electrically connected by electrical connectors, such as wires 717. The wires 717 are separated from the top package 702 by adhesive or a spacer 721, which bonds the top package 702 to the topside die 713.

The top package 702 includes a top substrate 714 and a top die 716 attached on the top of the top substrate 714. The top die 716 is electrically connected to the top substrate 714 by electrical connectors, such as wires 718. The top die 716 and the wires 718 are encapsulated within a top encapsulant 720 that protects the components of the top package 702 from the environment during handling.

The top package 702 is electrically connected by electrical connectors, such as wires 724, to the bottom substrate 706. The top package 702 and the wires 724 are encapsulated within a topside encapsulant 726 to form a topside package 719 for protection of the wires 724 from the environment.

System electrical connectors, such as solder balls 728, are bonded to the bottom of the bottom substrate 706 around the bottom die 708 and the bottom encapsulant 712. The solder balls 728 and the bottom encapsulant 712 are sized so that the bottom encapsulant 712 is clear of any structures under the stacked die package system 700 in use.

Figure 8:
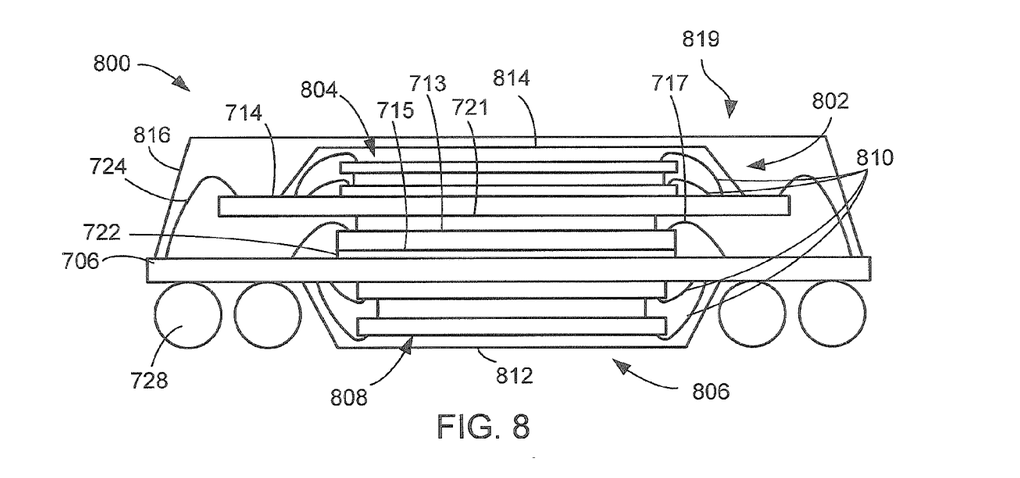
FIG. 8 is a cross-sectional view of stacked die package system of the third type in accordance with another embodiment of the present invention.

Referring now to FIG. 8, therein is shown a cross-sectional view of the first type of stacked die package system 200 in accordance with another embodiment of the present invention. Similar elements to FIG. 7 use the same numbers.

A top package 802 may include two or more stacked dies 804 on the top substrate 814. A bottom package 806 may also include two or more stacked dies 808. The stacked dies 804 and 808 are wire bonded to other dies and to the bottom substrate 706 by electrical connectors, such as wires 810.

The topside die 713 is attached to the bottom substrate 706 by the adhesive 715 and electrically connected by the electrical connectors, such as the wires 717. The wires 717 are separated from the top package 702 by the adhesive or spacer 721, which bonds the top package 802 to the topside die 713. The topside die 713 could also be stacked.

Bottom, top, and topside encapsulants 812, 814, and 816 have greater vertical thicknesses to accommodate the increased numbers of dies. The bottom encapsulant 812 is part of the bottom package 806, the top encapsulant 814 is part of the top package 802, and the topside encapsulant 816 is part of the topside package 819.

Figure 9:
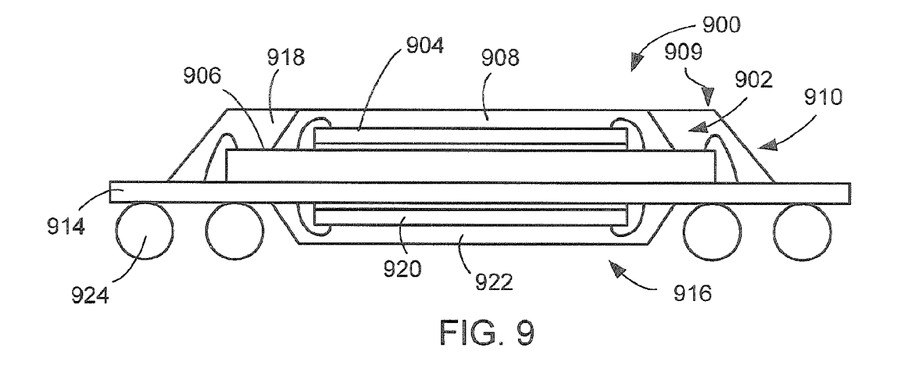
FIG. 9 is a cross-sectional view of a stacked die package system in accordance with a first embodiment of the present invention.

Referring now to FIG. 9, therein is shown a cross-sectional view of a stacked die package system 900 in accordance with a first embodiment of the present invention.

A top package 902 includes a top die 904 mounted on a top substrate 906 and covered by an encapsulant 908.

The top package 902 is part of a top package 910 further including an integrated circuit 912 mounted on a bottom substrate 914 of a bottom package 916. The top package 910 includes an encapsulant 918 in which the top surface is coplanar with top surface of the encapsulant 908.

Simple interior flat topped molds can be used for making the top surfaces coplanar.

The bottom package 916 includes an integrated circuit 920 mounted on the bottom substrate 914 and covered by an encapsulant 922.

Solder balls 924 are formed on the bottom surface of the bottom substrate 914 adjacent to the bottom package 916.

Figure 10:
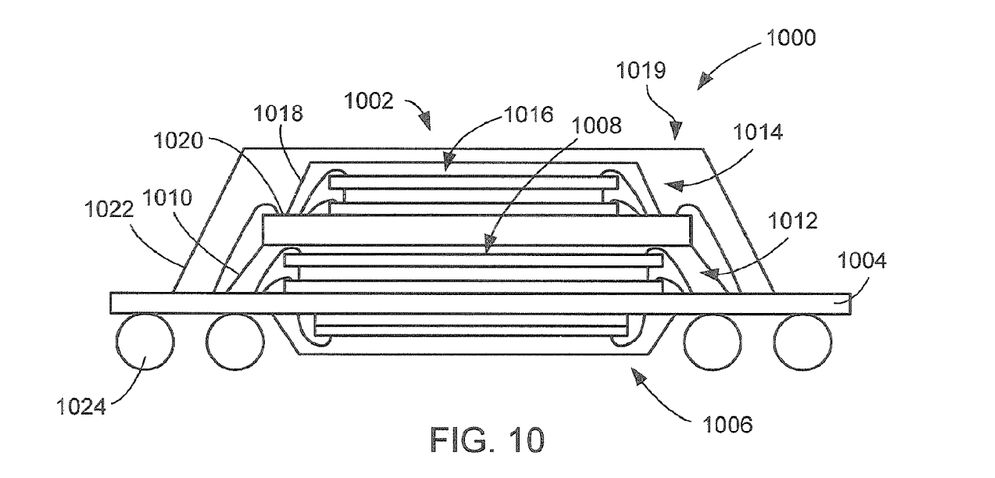
FIG. 10 is a cross-sectional view of a stacked die package system in accordance with a second embodiment of the present invention.

Referring now to FIG. 10, therein is shown a cross-sectional view of a stacked die package system 1000 in accordance with second embodiment of the present invention. A topside package 1002 is mounted to a top surface of a bottom substrate 1004, which is part of a bottom package 1006.

The topside package 1002 includes stacked dies 1008 mounted on the bottom substrate 1004 and covered by an encapsulant 1010 to form an intermediate package 1012. The encapsulant 1010 is flat on top for attachment of a top package 1014.

The top package 1014 includes stacked dies 1016 covered by an encapsulant 1018 mounted on a top substrate 1020. The encapsulant 1010 and the top package 1014 are covered by an encapsulant 1022 on the bottom substrate 1004.

The structure of the bottom package 1006 is similar to the structure of the bottom package 916 of FIG. 9. Solder balls 1024 are formed on the bottom surface of the bottom substrate 1004 around the bottom package 1006.

Figure 11:
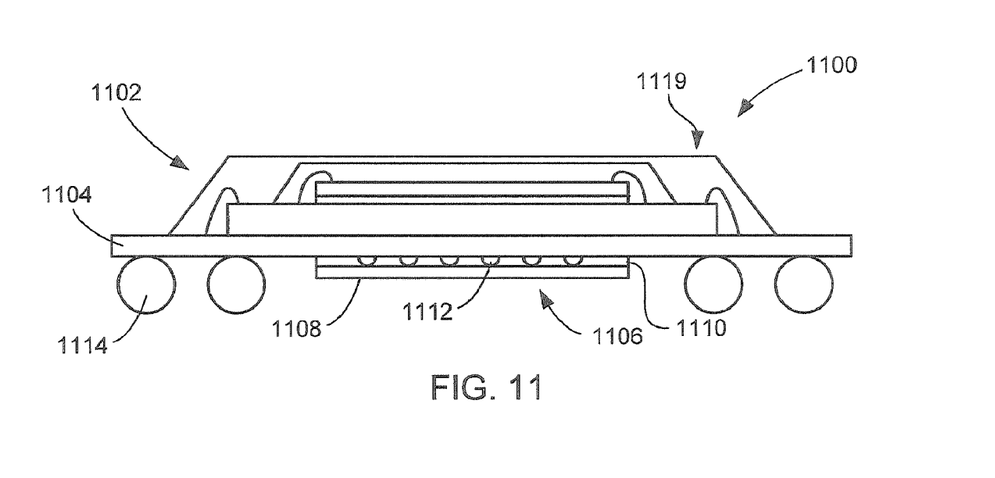
FIG. 11 is a cross-sectional view of a stacked die package system in accordance with a third embodiment of the present invention.

Referring now to FIG. 11, therein is shown a cross-sectional view of a stacked die package system 1100 in accordance with third embodiment of the present invention. A topside package 1102 is mounted to a top surface of a bottom substrate 1104 of a bottom package 1106.

The topside package 1102 is similar to the topside package 325 of FIG. 3F.

The bottom package 1106 includes a bottom die 1108 mounted to the bottom surface of the bottom substrate 1104 by an underfill adhesive 1110. The underfill adhesive 1110 encapsulates solder connectors 1112. Solder balls 1114 are formed on the bottom surface of the bottom substrate 1104 adjacent to the bottom package 1106.

Figure 12:
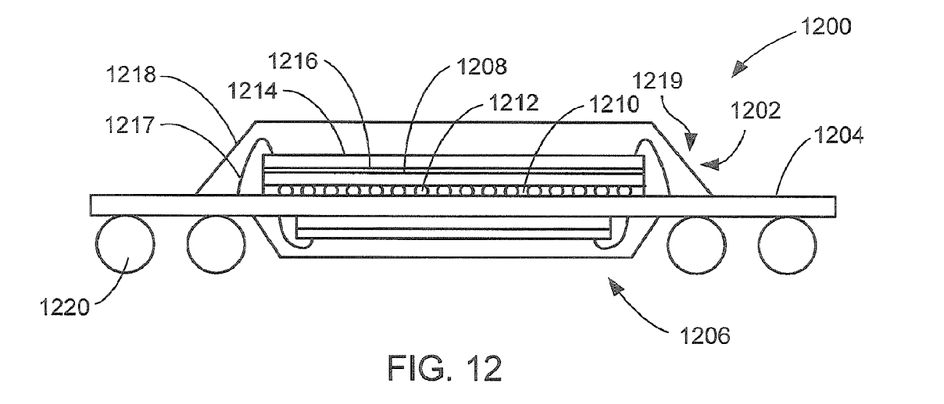
FIG. 12 is a cross-sectional view of a stacked die package system in accordance with a fourth embodiment of the present invention.

Referring now to FIG. 12, therein is shown a cross-sectional view of a stacked die package system 1200 in accordance with fourth embodiment of the present invention. A top package 1202 is mounted to a top surface of a bottom substrate 1204 of a bottom package 1206.

The top package 1202 includes a flip chip die 1208 acting as the top substrate, which is attached to the bottom substrate 1204 by an underfill adhesive 1210 and electrically connected by solder connectors 1212 that are encapsulated by the underfill adhesive 1210. A top die 1214 is bonded to the top of the flip chip die 1208 by an adhesive 1216 and is electrically connected by wires 1217. The flip chip die 1208, the top die 1214, and the adhesives 1210 and 1216 are covered by an encapsulant 1218.

The bottom package 1206 is the similar to the bottom package 916 of FIG. 9.

Solder balls 1220 are formed on the bottom surface of the bottom substrate 1204 adjacent to the bottom package 1206.

Figure 13:
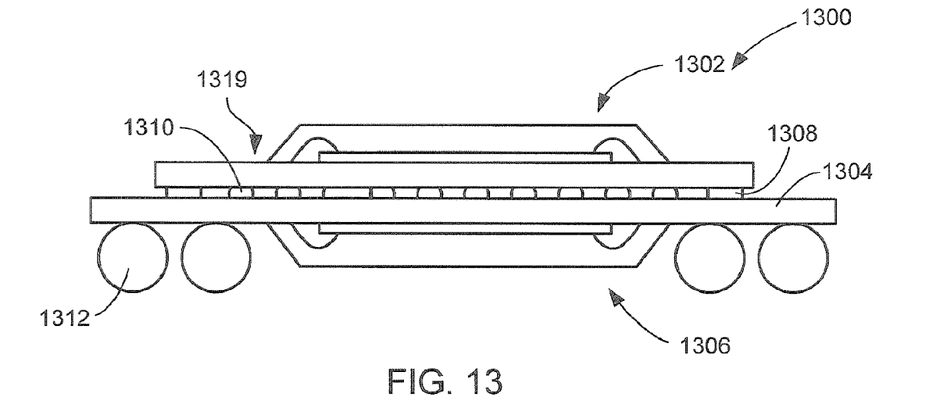
FIG. 13 is a cross-sectional view of a stacked die package system in accordance with a fifth embodiment of the present invention.

Referring now to FIG. 13, therein is shown a cross-sectional view of a stacked die package system 1300 in accordance with fifth embodiment of the present invention. A top package 1302 is mounted to a top surface of a bottom substrate 1304 of a bottom package 1306.

The top package 1302 is similar to the top package 402 of FIG. 4. The top package 1302 is attached to the bottom substrate 1304 using a pre-dot epoxy dispense process to deposit epoxy dots 1308 and electrically connected by solder connectors 1310. The epoxy dots 1308 control the collapse height of the solder connectors 1310.

The bottom package 1306 is similar to the bottom package 104 of FIG. 1. Solder balls 1312 are formed on the bottom surface of the bottom substrate 1304 around the bottom package 1306.

Figure 14:
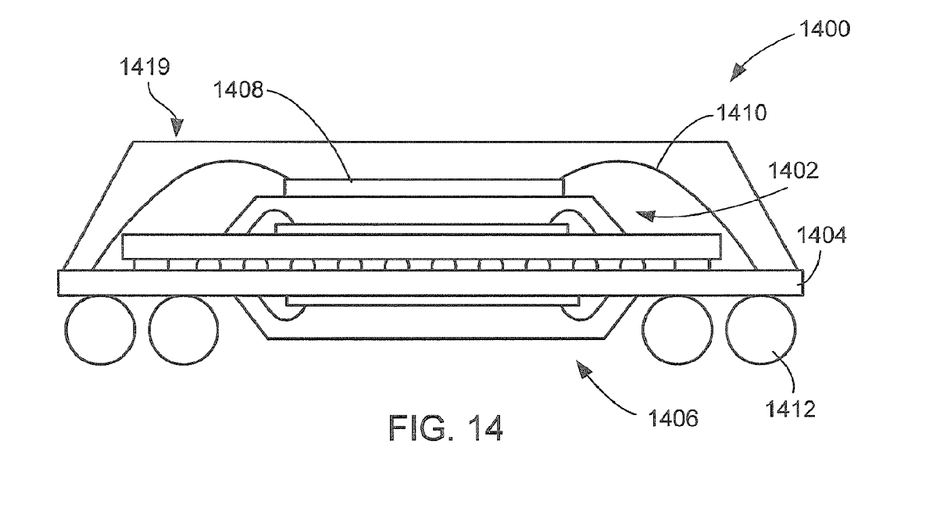
FIG. 14 is a cross-sectional view of a stacked die package system in accordance with a sixth embodiment of the present invention.

Referring now to FIG. 14, therein is shown a cross-sectional view of a stacked die package system 1400 in accordance with sixth embodiment of the present invention. A top package 1402 is mounted to a top surface of a bottom substrate 1404 of a bottom package 1406.

The top package 1402 is similar to the structure of the top package 1302 of FIG. 13 with a top die 1408 and electrical connectors, such as wires 1410, electrically connecting the top die 1408 to the bottom substrate 1404.

The bottom package 1406 is similar to the bottom package 104 of FIG. 1. Solder balls 1412 are formed on the bottom surface of the bottom substrate 1404 adjacent to the bottom package 1406.

Figure 15:
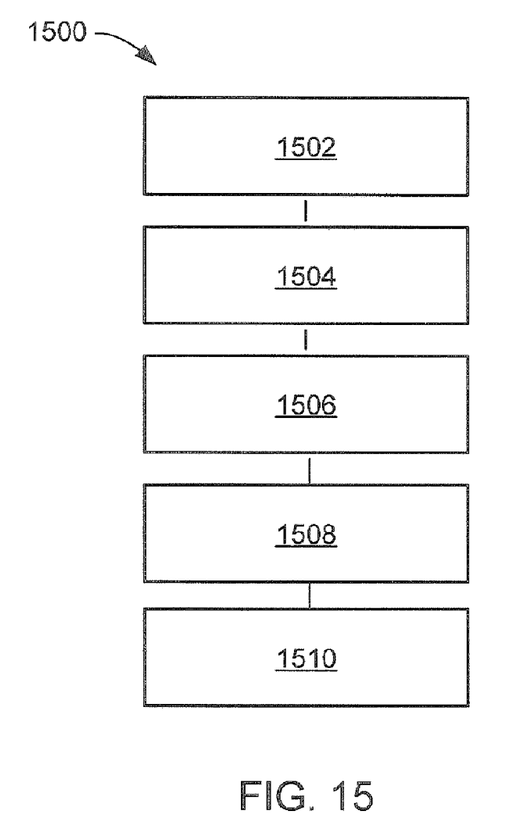
FIG. 15 is a flow chart of a system for forming a stacked die package system in accordance with an embodiment of the present invention.

Referring now to FIG. 15, therein is shown a flow chart of a stacked die package system 1500 for forming a stacked die package system in accordance with an embodiment of the present invention. The stacked die package system 1500 includes: forming a bottom package including a bottom substrate and a bottom die mounted and electrically connected under the bottom substrate in a block 1502; forming a top package including a top substrate and a top die mounted and electrically connected over the top substrate in a block 1504; mounting the top package by the top substrate over the bottom substrate in a block 1506; electrically connecting the bottom and top substrates in a block 1508; and mounting system electrical connectors under the bottom substrate adjacent the bottom die in a block 1510.

In greater detail, a method to form a stacked die package system in accordance with an embodiment of the present invention, is performed as follows:

(1) 1. connecting a topside package to a bottom of the substrate. (FIG. 3A)
(2) 2. encapsulating the topside package. (FIG. 3B)
(3) 3. inverting the topside package. (FIG. 3C)
(4) 4. placing a bottom package on substrate. (FIG. 3D)
(5) 5. encapsulating the bottom package. (306 of FIG. 3E)
(6) 6. attaching solder balls to the bottom of the substrate adjacent to the topside package. (308 of FIG. 3F)

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A process of making a stacked die package system comprising:
   forming a bottom package including a bottom substrate and a bottom die mounted and electrically connected under the bottom substrate;
   forming a top package including a top substrate and a top die mounted and electrically connected over the top substrate;
   mounting the top package by the top substrate over the bottom substrate; electrically connecting the bottom and top substrates; and
   mounting system electrical connectors under the bottom substrate adjacent the bottom die;
   wherein:
   forming the bottom package includes:
   mounting a plurality of bottom dies to the bottom substrate in a line, and electrically connecting the plurality of bottom dies to the bottom substrate; and
   singulating the bottom substrate into a plurality of bottom substrates, each of the plurality of bottom substrates having one of the plurality of bottom dies thereon.

2. The process of making a stacked die package system as claimed in claim 1 further comprising:
   mounting and electrically connecting a topside die to the bottom substrate between the bottom and top substrates.

3. The process of making a stacked die package system as claimed in claim 1 further comprising:
   testing the bottom package; and
   testing the top package.

4. A process of making a stacked die package system comprising:
   forming a bottom package including a bottom substrate and a bottom die, the bottom die mounted and having electrical connectors for electrical connection under the bottom substrate;
   encapsulating the bottom die, the electrical connectors therefor, or a combination thereof;
   forming a top package including a top substrate and a top die, the top die mounted and having electrical connectors for electrical connection over the top substrate;
   encapsulating the top die, the electrical connectors therefor, or a combination thereof;
   mounting the top package using the top substrate over the bottom substrate; electrically connecting the bottom and top substrates with substrate electrical connectors;
   encapsulating the top package; and mounting system electrical connectors under the bottom substrate around the die of the bottom package, package;
   wherein:
   forming the bottom package includes:
   mounting a plurality of bottom dies to the bottom substrate in a line, and electrically connecting the plurality of bottom dies to the bottom substrate;
   mounting a plurality of top packages to the bottom substrate; and
   singulating the bottom substrate into a plurality of bottom substrates, each of the plurality of bottom substrates having one of the plurality of bottom dies and one of the plurality of top packages thereon.

5. The process of making a stacked die package system as claimed in claim 4 further comprising:
   mounting and electrically connecting a topside die to the bottom substrate between the bottom and top substrates; and
   encapsulating the topside die or electrical connectors therefor.

6. The process of making a stacked die package system as claimed in claim 4 further comprising:
   testing the bottom package; and
   testing the top die package separately from the bottom package.

7. A stacked die package system comprising:
   a bottom package including a bottom substrate and a bottom die mounted under the bottom substrate;
   a topside package including a top substrate and a die mounted over the top substrate, the topside package mounted by the top substrate over the bottom substrate;
   electrical connectors from the top substrate to the bottom substrate; and
   system electrical connectors mounted on the bottom of the bottom substrate adjacent the die mounted under the bottom substrate;
   further comprising:
   an encapsulated topside die mounted between the bottom and top substrates;
   a top package mounted over the encapsulated topside die; and
   a topside encapsulant over the encapsulated topside die and the top package.

8. The system as claimed in claim 7 wherein:
the electrical connectors from the top substrate to the bottom substrate including wires or solder connectors.

9. The system as claimed in claim 7 further comprising:
a topside die mounted between the bottom and top substrates.

10. The system as claimed in claim 7 further comprising:
epoxy dots disposed between the bottom package and the top package.

11. The system as claimed in claim 7 further comprising:
a top die mounted over the topside package; and
electrical connectors from the top die to the bottom substrate.

12. A stacked die package system comprising:
a bottom package including a bottom substrate and an encapsulated bottom die mounted under the bottom substrate;
a topside package including a top substrate and an encapsulated top die mounted over the substrate, the topside package mounted by the top substrate over the bottom substrate;
electrical connectors from the topside package to the bottom substrate; and
system electrical connectors mounted on the bottom of the bottom substrate around the encapsulated bottom die;
further comprising:
an encapsulated topside die mounted between the bottom and top substrates;
a top package mounted over the encapsulated topside die; and
a topside encapsulant over the encapsulated die, the top package, and the electrical connectors from the top package to the bottom substrate.

13. The system as claimed in claim 12 wherein:
the electrical connectors from the topside package to the bottom substrate include wires or solder connectors, the solder connectors encapsulated in a top underfill adhesive;
the encapsulated bottom die has solder connectors encapsulated in a bottom underfill adhesive; or
a combination thereof.

14. The system as claimed in claim 12 further comprising:
a topside die mounted between the bottom and top substrates; and
electrical connectors electrically connecting the topside die to the bottom substrate.

15. The system as claimed in claim 12 further comprising:
epoxy dots disposed between the bottom and top substrates; and
solder connectors encapsulated in a topside underfill adhesive among the epoxy dots.

16. The system as claimed in claim 12 further comprising:
a top die mounted over the topside package;
electrical connectors from the top die to the bottom substrate; and
an encapsulant over the top die and the electrical connectors from the top die to the bottom substrate.

* * * * *

UNITED STATES PATENT AND TRADEMARK OFFICE
CERTIFICATE OF CORRECTION

PATENT NO. : 7,279,785 B2 Page 1 of 1
APPLICATION NO. : 11/164160
DATED : October 9, 2007
INVENTOR(S) : Ha et al.

It is certified that error appears in the above-identified patent and that said Letters Patent is hereby corrected as shown below:

Column 10
 Claim 4, line 26, delete "package,"

Signed and Sealed this

Eighteenth Day of December, 2007

JON W. DUDAS
*Director of the United States Patent and Trademark Office*